United States Patent
Liu

(10) Patent No.: US 12,143,129 B2
(45) Date of Patent: Nov. 12, 2024

(54) DECODING METHOD, DECODING DEVICE, AND READABLE STORAGE MEDIUM

(71) Applicant: TCL CHINA STAR OPTOELECTRONICS TECHNOLOGY CO., LTD., Shenzhen (CN)

(72) Inventor: Jinfeng Liu, Shenzhen (CN)

( * ) Notice: Subject to any disclaimer, the term of this patent is extended or adjusted under 35 U.S.C. 154(b) by 0 days.

(21) Appl. No.: 17/600,117

(22) PCT Filed: May 31, 2021

(86) PCT No.: PCT/CN2021/097135
§ 371 (c)(1),
(2) Date: Sep. 30, 2021

(87) PCT Pub. No.: WO2022/156113
PCT Pub. Date: Jul. 28, 2022

(65) Prior Publication Data
US 2024/0056096 A1  Feb. 15, 2024

(30) Foreign Application Priority Data
Jan. 19, 2021  (CN) .......................... 202110070409.0

(51) Int. Cl.
*H03M 7/14* (2006.01)
*H03M 7/28* (2006.01)

(52) U.S. Cl.
CPC .............. *H03M 7/14* (2013.01); *H03M 7/28* (2013.01)

(58) Field of Classification Search
CPC .......... H03M 7/14; H03M 7/28; H04N 19/44; H04N 19/42
See application file for complete search history.

(56) References Cited

U.S. PATENT DOCUMENTS

| 10,790,936 | B1* | 9/2020 | Mansour | H04J 13/004 |
| 2009/0317005 | A1* | 12/2009 | Lee | H04N 19/156 |
| | | | | 382/233 |
| 2012/0093214 | A1 | 4/2012 | Urbach | |
| 2012/0191967 | A1* | 7/2012 | Lin | G06F 17/16 |
| | | | | 713/100 |

(Continued)

FOREIGN PATENT DOCUMENTS

| CN | 108777606 A | 11/2018 |
| CN | 108965173 A | 12/2018 |
| CN | 109165001 A | 1/2019 |

(Continued)

OTHER PUBLICATIONS

International Search Report in International application No. PCT/CN2021/097135, mailed on Aug. 16, 2021.

(Continued)

*Primary Examiner* — Sung S Ahn

(57) ABSTRACT

This application discloses a decoding method, a decoding device, and a readable storage medium. The decoding method can perform a simple logic operation on the corresponding specified bits in the first bitstream, and generate the corresponding fourth bitstream accordingly to obtain information before encoding. The logic design of this decoding method is simple, which can reduce the complexity of logic circuit design and improve the reliability of decoding.

20 Claims, 3 Drawing Sheets

(56) References Cited

U.S. PATENT DOCUMENTS

2013/0077695 A1  3/2013  Luna et al.

FOREIGN PATENT DOCUMENTS

CN  110086575 A  8/2019
CN  110620635 A  12/2019

OTHER PUBLICATIONS

Written Opinion of the International Search Authority in International application No. PCT/CN2021/097135, mailed on Aug. 16, 2021.
Chinese Office Action issued in corresponding Chinese Patent Application No. 202110070409.0 dated Nov. 3, 2021, pp. 1-5.
China Excellent Master's Thesis Full-text Database (Electronic Journal) Full text Mar. 15, 2017 The Fast Implementation Method of BCH Coding and Decoding CAI, Erlong.

* cited by examiner

DECODING METHOD, DECODING DEVICE, AND READABLE STORAGE MEDIUM

CROSS REFERENCE TO RELATED APPLICATIONS

The disclosure a US national phase application based upon International Application No. PCT/CN2021/097135, filed on May 31, 2021, titled "DECODING METHOD, DECODING DEVICE, AND READABLE STORAGE MEDIUM" which claims priority to Chinese patent application No. 202110070409.0, titled "DECODING METHOD, DECODING DEVICE, AND READABLE STORAGE MEDIUM" filed with the National Intellectual Property Administration on Jan. 19, 2021, which is incorporated by reference in the present application in its entirety.

BACKGROUND OF DISCLOSURE

1. Field of Disclosure

The application relates to the field of data transmission technology, and in particular to a decoding method, decoding device, and readable storage medium.

2. Description of Related Art

A decoding method is a specific method and a process of reproducing digital data to what it represents or converting electrical pulse signals, optical signals, or radio waves into the information or data they represent. The decoding process is a process by which a receiver reproduces received symbols or codes to information, as opposed to an encoding process.

An output side encodes and then transmits a signal, which can improve the transmission efficiency. For different encoding methods, a receiving side needs to provide decoding methods that match or correspond to the encoding methods to reduce a bit error rate (BER).

Technical Problem

This application provides a decoding method, a decoding device, and a readable storage medium, which alleviates the problem of high cost and high BER due to the complex design of decoding logic.

SUMMARY

In a first aspect, the application provides a decoding method comprising: obtaining a second bitstream based on a first bitstream, wherein the first bitstream comprises a first specified bit, a second specified bit, a third specified bit, and a fourth specified bit; processing the second bitstream to obtain a third bitstream based on a result of a first logical operation of the first specified bit and the second specified bit; and processing the third bitstream to obtain a fourth bitstream based on a result of a second logical operation of the third specified bit and the fourth specified bit, wherein the fourth bitstream comprises eight bits.

Based on the first aspect, in a first embodiment of the first aspect, the step of obtaining the second bitstream based on the first bitstream comprises: determining two flag bits in the first bitstream; and discarding the two flag bits to obtain the second bitstream.

Based on the first aspect, in a second embodiment of the first aspect, the step of processing the second bitstream to obtain the third bitstream based on the result of the first logical operation of the first specified bit and the second specified bit comprises: outputting the second bitstream as the third bitstream when the result of the first logical operation is logical false; and obtaining an inverse of a second bit number and an inverse of a fourth bit number in the first bitstream correspondingly as a value assigned to a first bit and a value assigned to a third bit in the second bitstream and outputting the second bitstream with the assigned values as the third bitstream when the result of the first logical operation is logical true.

Based on the second embodiment of the first aspect, in a third embodiment of the first aspect, the step of processing the second bitstream to obtain the third bitstream based on the result of the first logical operation of the first specified bit and the second specified bit further comprises: determining that the first specified bit and the second specified bit correspond to a zeroth bit and a first bit; and exclusive-or-operating the zeroth bit with the first bit to obtain the result of the first logical operation.

Based on the first aspect, in a fourth embodiment of the first aspect, the step of processing the third bitstream to obtain the fourth bitstream based on the result of the second logical operation of the third specified bit and the fourth specified bit comprises: outputting the third bitstream as the fourth bitstream when the result of the second logical operation is logical false; and obtaining an inverse of a seventh bit number and an inverse of a ninth bit number in the first bitstream correspondingly as a value assigned to a fifth bit and a value assigned to a seventh bit in the third bitstream and outputting the third bitstream with the assigned values as the fourth bitstream when the result of the second logical operation is logical true.

Based on the fourth embodiment of the first aspect, in a fifth embodiment of the first aspect, the step of processing the third bitstream to obtain the fourth bitstream based on the result of the second logical operation of the third specified bit and the fourth specified bit further comprises: determining that the third specified bit and the fourth specified bit correspond to a fifth bit and a sixth bit; and exclusive-or-operating the fifth bit with the sixth bit to obtain the result of the second logical operation.

Based on any of the above embodiments of the first aspect, in a sixth embodiment of the first aspect, the first bitstream comprises ten bits.

Based on the sixth embodiment of the first aspect, in a seventh embodiment of the first aspect, a number of bits included in the fourth bitstream are the same as a number of bits included in the second bitstream and/or the third bitstream.

In a second aspect, the application provides a decoding device comprising a processor, the processor for executing instructions to implement the decoding method in any of the above embodiments.

In a third aspect, the application provides a readable storage medium, the readable storage medium storing instructions, the instructions being executed to implement the decoding method in any of the above embodiments.

Useful Effects:

The decoding method, decoding device, and readable storage medium provided in this application can obtain the pre-encoding information by performing simple logic operations on the corresponding specified bits in the first bitstream, whereby the corresponding fourth bitstream is generated. The simple logic design of this decoding method not only can reduce the complexity of logic circuit design but also can improve the reliability of decoding.

DETAILED DESCRIPTION OF EMBODIMENTS

To make the purpose, technical solutions, and effects of the application clearer and more definite, the application is further detailed hereinafter with reference to the accompanying drawings and by way of example. Note that specific embodiments described herein are intended to explain the application only, and are not intended to limit the application.

Note that symbols or expressions appearing in this application represent the meanings shown below.

The lowest bit in the corresponding bitstream is the zeroth bit, the next lowest bit is the first bit, and so on up to the highest bit. For example, a bitstream of 011 has a zeroth bit corresponding to a zeroth bit number of 1, a first bit corresponding to a first bit number of 1, and a second bit number corresponding to a second bit number of 0. Where the first bit represents a position in that bitstream, and the first bit number represents the content corresponding to the first bit.

"A==B" stands for: A is constantly equal to B.
"A=~B" stands for: B is inverted and assigned to A.
"~B" stands for: B is inverted.

Figure 1:
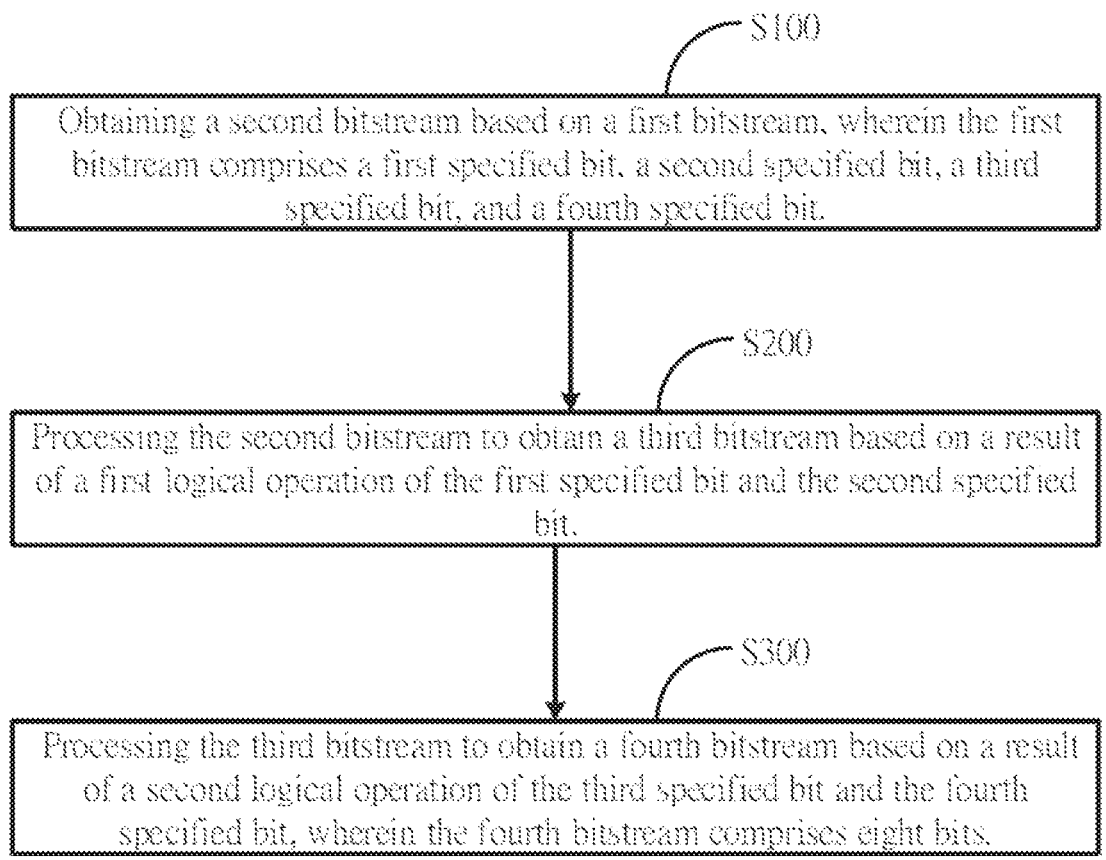
FIG. 1 is a first flow diagram showing a decoding method provided by an embodiment of the application.

Referring to FIGS. 1 to 4, wherein, as shown in FIG. 1, this embodiment provides a decoding method comprising the following steps.

Step S100: Obtaining a second bitstream based on a first bitstream, wherein the first bitstream comprises a first specified bit, a second specified bit, a third specified bit, and a fourth specified bit.

Wherein, the step of obtaining the second bitstream based on the first bitstream, comprises: determining two flag bits in the first bitstream; and discarding the two flag bits to obtain the second bitstream. Specifically, the two flag bits may be the zeroth bit and the fifth bit in the first bitstream.

Step S200: Processing the second bitstream to obtain a third bitstream based on a result of a first logical operation of the first specified bit and the second specified bit.

The step of processing the second bitstream to obtain the third bitstream based on the result of the first logical operation of the first specified bit and the second specified bit, further comprising: determining that the first specified bit and the second specified bit correspond to the zeroth bit and the first bit; and exclusive-or-operating the zeroth bit with the first bit to obtain the result of the first logical operation.

The step of processing a second bitstream to obtain a third bitstream based on a result of a first logical operation of the first specified bit and the second specified bit, comprising:
outputting the second bitstream as the third bitstream when the result of the first logical operation is logical false; and
obtaining an inverse of a second bit number and an inverse of a fourth bit number in the first bitstream correspondingly as a value assigned to a first bit and a value assigned to a third bit in the second bitstream and outputting the second bitstream with the assigned values as the third bitstream when the result of the first logical operation is logical true.

Step S300: Processing the third bitstream to obtain a fourth bitstream based on a result of a second logical operation of the third specified bit and the fourth specified bit, wherein the fourth bitstream comprises eight bits.

The step of processing the third bitstream to obtain the fourth bitstream based on the result of the second logical operation of the third specified bit and the fourth specified bit further includes: determining that the third specified bit and the fourth specified bit correspond to the fifth bit and the sixth bit; and exclusive-or-operating the fifth bit with the sixth bit to obtain the result of the second logical operation.

The step of processing the third bitstream to obtain the fourth bitstream according to the result of the second logical operation of the third specified bit and the fourth specified bit comprises: outputting the third bitstream as the fourth bitstream when the result of the second logical operation is logical false; and obtaining an inverse of a seventh bit number and an inverse of a ninth bit number in the first bitstream correspondingly as a value assigned to a fifth bit and a value assigned to a seventh bit in the third bitstream and outputting the third bitstream with the assigned values as the fourth bitstream when the result of the second logical operation is logical true. In particular, note that the fourth bit stream is the data or information obtained after decoding.

Figure 2:
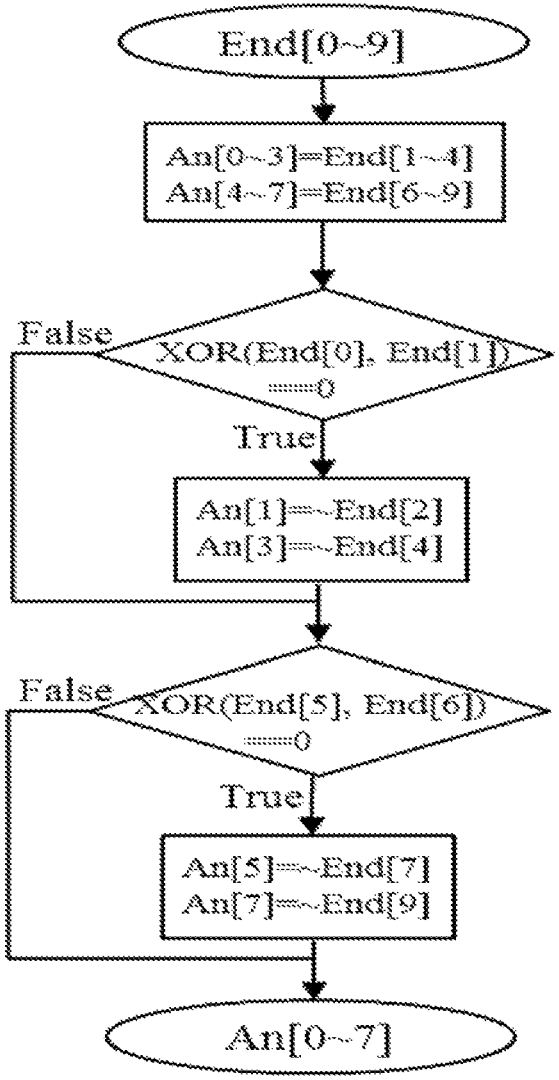
FIG. 2 shows a second flow diagram of the decoding method provided by an embodiment of the application.

As shown in FIG. 2, in one embodiment, the first bitstream may, but is not limited to, include ten bits. The fourth bitstream may, but is not limited to, include eight bits.

For example, first, two flag bits in the first bitstream End[0~9] (the original encoded bitstream) are ignored, and the first bit number to the fourth bit number, e.g., End[1~4], in the first bitstream are assigned to the zeroth bit to the third bit, e.g., An[0~3], in the second bitstream, and the sixth bit number to the ninth bit number, e.g. End[6~9], in the first bitstream are assigned to the fourth bit to the seventh bit, e.g., An[4~7], in the second bitstream to obtain the second bitstream, the second bitstream is 8-bit data An[0~7].

Then, for two specified bits in the first bitstream End [0~9], for example, the zeroth bit End [0] and the first bit End [1], a result of the exclusive-or operation (XOR) between the zeroth bit End [0] and the first bit End[1] is determined. If the result of the exclusive-or operation is non-zero, the second bitstream is directly output as the third bitstream. If the result of the XOR operation is zero, the second bit number of the first bitstream is inverted and assigned to the first bit of the second bitstream, and the fourth bit number of the first bitstream is inverted and assigned to the third bit of the second bitstream, and then the second bitstream with the assigned values is output as the third bitstream.

Then, for other two specific bits in the first bitstream End [0~9], e.g., the fifth bit number End [5] and the sixth bit number End [6], a result of the exclusive-or operation between the fifth bit number End [5] and the sixth bit number End [6] is determined, and if the result of the exclusive-or operation is non-zero, the third bitstream is directly output as the fourth bitstream. If the result is zero, the seventh bit number of the first stream is inverted and assigned to the fifth bit of the third stream, and the ninth bit number of the first stream is inverted and assigned to the seventh bit of the third stream, and then the third stream with the assigned values is output as the fourth bitstream. The finally obtained fourth bitstream An [0~7] is the decoded signal.

It can be understood that the decoding method provided by the application, by performing simple logic operations on the corresponding specified bits in the first bitstream and generating the corresponding fourth bitstream accordingly, can obtain the information before encoding. The logic design of this decoding method is simple, which not only can reduce the complexity of the logic circuit design and but also can improve the reliability of decoding. Moreover, the decoding method provided by the application facilitates the reception of correct signals.

In one of the embodiments, the application provides a display panel that includes a source driver or a data driver. The source driver is configured to receive a target bitstream of 12 bits and decode the target bitstream into a raw data stream of 10 bits, and then use the raw data stream as a data signal to drive the display panel for display correspondingly.

In one embodiment, the display panel may be, but is not limited to, an OLED display panel, and may also be a liquid crystal display panel.

The OLED display panel is a display panel made of electric organic light-emitting diodes. It is considered to be the next generation of emerging technology for flat panel display applications because of its excellent features such as electro-excited self-light-emitting diodes, no backlight, high contrast ratio, thin thickness, wide viewing angle, fast response time, panel flexibility, wide operating temperature range, and simple structure and process.

Organic Light-Emitting Diode (OLED) displays are becoming increasingly common, most notably in products such as cell phones, media players, and small entry-level TVs. Unlike standard LCDs, OLED pixels are driven by a current source. To understand how and why OLED power supply affects display image quality, one must first understand OLED display technology and power supply requirements. This article will explain the latest OLED display technology, discuss the main power supply requirements and solutions, and also introduce innovative power supply architectures specifically designed for OLED power supply requirements.

Backplane Technology for Flexible displays: High-resolution color active matrix organic light-emitting diode (AMOLED) displays require an active matrix backplane, which uses active switches to switch the pixels on and off. The liquid crystal (LC) display amorphous silicon process is mature enough to supply low-cost active matrix backplanes and can be used for OLEDs. Many companies are developing organic thin film transistor (OTFT) backplane processes for flexible displays, which can also be used for OLED displays to enable the introduction of full-color flexible displays. OLEDs, whether standard or flexible, all require the same power supply and drive technology. To understand the OLED technology and interaction between OLED functions and power supply, it is necessary to dig into the technology. OLED displays are a self-luminous display technology that does not require any backlighting at all. Materials used in OLEDs are organic materials with a suitable chemical structure. OLED technology requires a current-controlled drive method. OLED has electrical characteristics quite similar to standard light-emitting diodes (LEDs), where the luminance depends on the LED current. A control circuit using a thin-film transistor (TFT) is required to turn the OLED on and off and control the OLED current.

As with any battery-powered device, long battery standby time can only be achieved when the converter is operating at the highest efficiency in the overall load current range, which is especially important for OLED displays. An OLED display draws most power when rendering pure white and relatively little for any other display color because only white requires all fully lit red, green and blue sub-pixels. For example, a 2.7-inch (2.7") display requires 80 mA to render a pure white image, but only 5 mA to display other icons or graphics. Therefore, the OLED power supply needs to achieve high converter efficiency for all the load currents. To achieve such efficiency, advanced power saving mode technology needs to be applied to reduce the load current to lower the converter switching frequency. This is done through the voltage-controlled oscillator (VCO), and thus can minimize possible EMI problems and can control the minimum switching frequency outside the general 40 kHz audio range, which can avoid ceramic input or output capacitors to generate noise. This is particularly important when using such devices in cell phone applications, and can simplify the design process.

White light is not the most power consumptive if in terms of the light-emitting characteristics, but is so if in terms of the power consumption per luminance value. For example, synthesizing of red, blue, and green of luminance value 10 will produce white light of 30 luminance value. Therefore, the red, blue, and green luminance values of 3.3 synthesize a white light value of 10 (theoretical value). Blue light consumes the most power, whether in LED or OLED, to provide the same luminance for human eyes.

Organic light-emitting display technology is made of a very thin coating of organic material and a glass substrate. The color of OLED light depends on the material of the organic light-emitting layer, so manufacturers can change the material of the light-emitting layer to get the desired color. Active array OLEDs have a built-in electronic circuit system so that each pixel is independently driven by a corresponding circuit. OLED has the advantages of simple structure, self-illumination without backlighting, high contrast ratio, thin thickness, wide viewing angle, fast response time, flexibility panel, wide temperature range, etc. The technology provides the best way to view photos and videos and is less restrictive to the camera design.

The increasing complexity and information density of automotive information systems has led to in-vehicle displays that are no longer just one basic centralized instrument display, but meet the increasingly complex and diverse needs of in-vehicle information displays. The market of the in-vehicle display is divided by application into in-vehicle navigation devices, in-vehicle TV, and in-vehicle information systems; and by assembly time into two markets: original and aftermarket. The original market requires strict certification and is more difficult to enter. The post-assembly market does not require certification and is by far the largest market, about 20 times larger than the original market. In the future, as the car navigation system and so on become the standard equipment of the car, the proportion of new cars equipped with display, i.e., the original market, will gradually increase.

Automotive electronics need display products for environmental adaptability requirements, the general requirements for performance indicators of car display include: luminance 20~60 nits, room temperature operating life of 50000 hours, and withstand temperature range −40~85° C. In the North American automotive display market, vacuum fluorescent display (VFD) has long been popular because they have excellent luminance and proven good visibility.

With the rise of OLED and LCD technology, however, VFD is gradually losing its advantage because VFD is power consumptive and restrictive to go full color and in resolution.

LCD technology gradually began to be used in the field of in-vehicle display. However, the LCD technology being subject to the influence of the ambient temperature, has limited the application area of in-vehicle display products. The liquid crystal material used to make the LCD will become liquid when the ambient temperature is too high, and will cool down to crystal when the temperature is too low. No matter which state it becomes, the liquid crystal material no longer has the photoelectric effect that can be controlled by the electric field, resulting in malfunctioning LCD. Additionally, the contrast, viewing angle, and response speed of the LCD also change with the fluctuating temperature, so for the in-vehicle display under large environmental changes, LCD is not a good display method.

Compared with the mature TFT-LCD, organic electroluminescent display (OLED) technology is an active light-emitting display with high contrast ratio, wide viewing angle (up to) 170°, fast response (~1 μs), high luminous efficiency, low operating voltage (3-10V), ultra-thin and light (thickness less than 2 mm) and other advantages. Using OLED technology to make the car display can have a thinner and more attractive appearance, better color display image quality, wider viewing range, and greater design flexibility. More importantly, OLED environmental adaptability is far superior to the LCD, can withstand the temperature range of −40~85° C. Additionally, OLED is lead-free and will not cause pollution to the environment. Therefore, OLED display applications in the automotive field have great advantages.

OLED displays bring great advantages to car manufacturers. They can, without perforating and wiring works in the car as in the past, quickly install the car dashboard lighting system. Additionally, OLED technology can bring the perfect feeling to high-end luxury cars. For luxury car manufacturers and dealers, this means significant savings and more consumers satisfaction. OLED life has been greatly improved, with a life span of 40,000 to 50,000 hours in conventional environments already comparable to the life span level of TFT-LCD. The operating temperature range of in-vehicle display OLED products has reached −40~85° C. The life of monochrome products reached 55,000 hours (70 nit) and 50,000 hours (80 nit). The operating temperature of car chips is still in the process of further improvement.

Due to the above advantages, the commercial OLED display can be applied to POS and ATM machines, copiers, and game machines, in the field of communications, can be applied to cell phones and mobile network terminals, in the computer field can be massively applied to PDA, commercial PC, home PC, and notebook computers, in consumer electronics field can be applied to stereo equipment, digital cameras, portable DVD device, in the field of consumer electronics, in industrial applications, can be applied to instruments and meters, and in the field of transportation, can be applied to GPS and aircraft instruments.

A flexible display refers to the flexible OLED. The successful mass production of flexible display is not only a major benefit to the manufacturing of a new generation of high-end smart phones, but also bring far-reaching impact on wearable devices because of its low power consumption, bendable characteristics. The application of flexible display will be widely used with the continuous penetration of personal smart terminals.

Flexible screen cell phones are cell phones with a bendable and flexible display, because its shape is like a roll, also known as a roll cell phone.

OLED is very thin and can be mounted on flexible materials such as plastic or metal foil. Using plastic instead of glass will make the display more durable and light-weighted. Flexible OLED panels in a concave from top to bottom can be bent in as small a radius as 700 mm.

OLED using a plastic substrate, rather than the common glass substrate, can make the display panel bendable and less likely to break by virtue of thin-film encapsulation technology and a protective film applied to the back of the panel. Flexible screens can be curled but not folded. Future products should be foldable and more versatile in shape.

The display is cut from the panel. Bendable displays, also known as flexible screens, are deemed as the primary stage product of the display revolution, with the ultimate goal of igniting the revolution of mobile and wearable electronic devices.

OLED preparation solution is to use vacuum evaporation technology to prepare organic functional layers and cathode layers, which requires expensive evaporation equipment and high production cost with low production efficiency. Additionally, the vacuum vapor deposition equipment with limited size has difficulty in realizing the preparation of large-area displays. Compared with vacuum thermal vapor deposition, preparation through a solution method has the advantages of simple operation and low cost, and is suitable for low temperature or room temperature conditions, especially for the preparation of large-size OLED displays. With the rapid iteration of organic electronics technology, the liquid-phase processing technology of soluble organic materials is also becoming increasingly mature. The liquid-phase method, especially the print production process for the preparation of OLEDs, is considered to be one of the key methods to solve the existing bottlenecks in the development of OLEDs.

However, there are certain technical difficulties in the preparation of OLEDs by print production process, such as the uppermost layer of metal electrode solution will cause penetration and damage to materials of lower layers, resulting in device leakage and cannot work properly. SHANGHAI MIFANG ELECTRONIC TECHNOLOGY CO LTD has been dedicated to the fully print production process of OLED display, especially to solving the liquid phase preparation process of the upper layer of the metal electrode. After two years of dedicated research and development, we have developed unique alcohol-based and organic-based electron transport layer ink, which can effectively block the penetration of electrode solution when printing or printing the top layer electrode, thus realizing the print production process preparation. In particular, the print production process can achieve specific patterns of luminescence without the need for vapor deposition instruments or customized masks.

Figure 3:
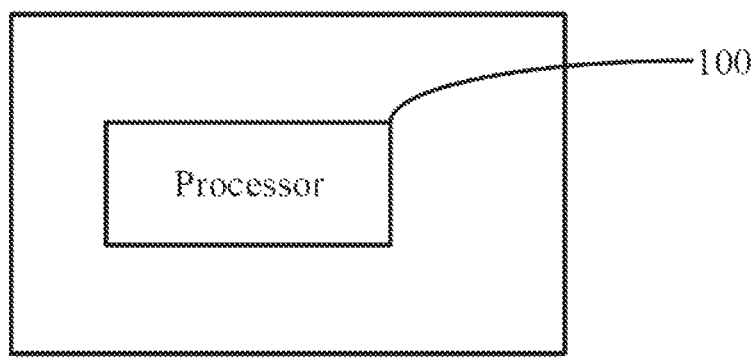
FIG. 3 is a schematic diagram showing a structure of a decoding device provided by an embodiment of the application.

As shown in FIG. 3, in one embodiment, the application provides a decoding device that includes a processor 100. Additionally, the decoding device may also include a memory (not shown in the figures).

The processor 100 controls the operation of the decoding device. The processor 100 may also be referred to as a CPU (Central Processing Unit). The processor 100 may be an integrated circuit chip having processing capability for signal sequences. The processor 100 may also be a general-purpose processor, a digital signal sequence processor (DSP), an application-specific integrated circuit (ASIC), a field-programmable gate array (FPGA) or other programmable logic devices, a discrete gate or transistor logic device, or a discrete hardware component. The general-purpose processor may be a microprocessor, or the processor may also be any conventional processor, etc.

The processor 100 is used to execute instructions to implement the decoding method provided by any of the above embodiments and possible combinations.

In summary, the decoding device provided in this application can obtain pre-encoded information by performing simple logical operations on the corresponding specified bits in the first bitstream, whereby the corresponding fourth bitstream is generated. The simple logical design of this decoding method can reduce the complexity of the logic circuit design and improve the reliability of the decoding.

Figure 4:
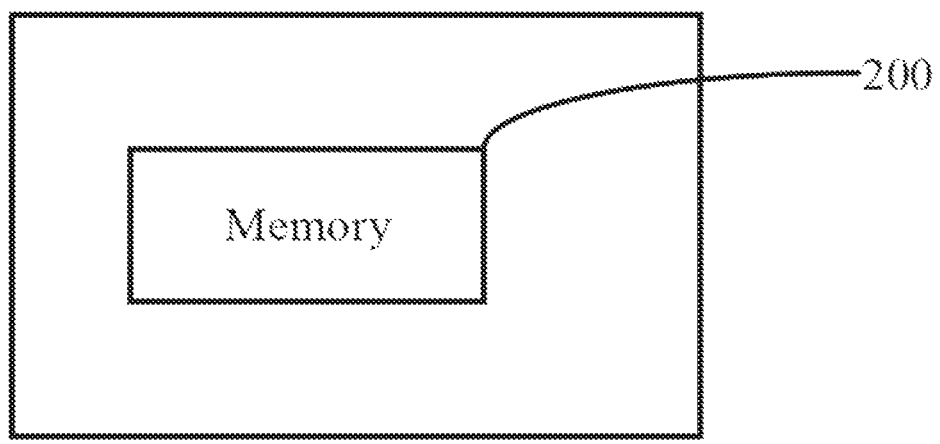
FIG. 4 is a schematic diagram showing a structure of a readable storage medium provided by an embodiment of the application.

As shown in FIG. 4, in one of the embodiments, the application provides a readable storage medium comprising a memory 200. The memory 200 stores instructions which, when executed, implement the decoding method provided by any of the above embodiments and possible combinations. The memory 200 may include at least one of Read-Only Memory (ROM), Random Access Memory (RAM), Flash Memory (Flash Memory), a hard disk, an optical disk.

In the several embodiments provided by the present invention, note that the disclosed methods and apparatus, can be implemented in other ways. For example, the embodiments of decoding devices described above are merely schematic. For example, the division of the modules or units described, is only a logical functional division, and the actual implementation can be divided in another way. For example, multiple units or components can be combined or can be integrated into another system, or some features can be skipped, or not implemented. Additionally, the mutual coupling or direct coupling or communication connections shown or discussed can be indirect coupling or communication connections through some interface, device or unit, which can be electrical, mechanical, or in other forms.

The units illustrated as separate components may or may not be physically separated, and the components shown as units may or may not be physical units, i.e., they may be located in one place or may be distributed to a plurality of network units. Some or all of these units may be selected according to actual needs to achieve the purpose of the present embodiments.

Additionally, each functional unit in each embodiment of the present invention can be integrated in a single processing unit, or each unit can be physically formed individually, or two or more units can be integrated in a single unit. The integrated units can be implemented either in the form of hardware or software functional units.

The integrated units may be stored in a computer-readable storage medium if being implemented in the form of a software functional unit and sold or used as a separate product. Based on this understanding, the technical solution of the present invention, or the part of it that essentially contributes to the prior art or all or part of it, may be embodied in the form of a software product. The computer software product is stored in a storage medium and includes a number of instructions to enable a computer device (which may be a personal computer, a server, or a network device) or a processor to perform all or some of the steps of the method described in various embodiments of the present invention. The aforementioned storage media include USB flash drives, mobile hard drives, Read-Only Memory (ROM), Random Access Memory (RAM), disks, or CD-ROMs, and various other media that can store program code.

In summary, the readable storage medium provided by the application can obtain the pre-encoded information by performing a simple logical operation on the corresponding specified bits in the first bitstream, whereby the corresponding fourth bitstream is generated, and the logic design of this decoding method is simple, which can both reduce the complexity of the logic circuit design and improve the reliability of the decoding.

It is understood that to a person of ordinary skill in the art, equivalent substitutions or changes can be made according to the technical solution of the application and its inventive concept, and all such changes or substitutions shall fall within the scope of protection of the claims appended to the application.

What is claimed is:

1. A decoding method comprising:
    obtaining a second bitstream based on a first bitstream, wherein the first bitstream comprises a first specified bit, a second specified bit, a third specified bit, and a fourth specified bit;
    processing the second bitstream to obtain a third bitstream based on a result of a first logical operation of the first specified bit and the second specified bit in the first bitstream; and
    processing the third bitstream to obtain a fourth bitstream based on a result of a second logical operation of the third specified bit and the fourth specified bit in the first bitstream, wherein the fourth bitstream comprises eight bits.

2. The decoding method according to claim 1, wherein the step of obtaining the second bitstream based on the first bitstream comprises:
    determining two flag bits in the first bitstream, wherein the two flag bits are not the first specified bit, the second specified bit, the third specified bit, and the fourth specified bit in the first bitstream; and
    discarding the two flag bits to obtain the second bitstream.

3. The decoding method according to claim 1, wherein the step of processing the second bitstream to obtain the third bitstream based on the result of the first logical operation of the first specified bit and the second specified bit comprises:
    outputting the second bitstream as the third bitstream when the result of the first logical operation is logical false; and
    obtaining an inverse of a second bit number and an inverse of a fourth bit number in the first bitstream correspondingly as a value assigned to a first bit and a value assigned to a third bit in the second bitstream and outputting the second bitstream with the assigned values as the third bitstream when the result of the first logical operation is logical true.

4. The decoding method according to claim 3, wherein the step of processing the second bitstream to obtain the third bitstream based on the result of the first logical operation of the first specified bit and the second specified bit further comprises:
    determining that the first specified bit and the second specified bit correspond to a zeroth bit and a first bit; and
    exclusive-or-operating the zeroth bit with the first bit to obtain the result of the first logical operation.

5. The decoding method according to claim 1, wherein the step of processing the third bitstream to obtain the fourth bitstream based on the result of the second logical operation of the third specified bit and the fourth specified bit comprises:
    outputting the third bitstream as the fourth bitstream when the result of the second logical operation is logical false; and obtaining an inverse of a seventh bit number and an inverse of a ninth bit number in the first bitstream correspondingly as a value assigned to a fifth bit and a value assigned to a seventh bit in the third bitstream and outputting the third bitstream with the assigned values as the fourth bitstream when the result of the second logical operation is logical true.

6. The decoding method according to claim 5, wherein the step of processing the third bitstream to obtain the fourth bitstream based on the result of the second logical operation of the third specified bit and the fourth specified bit further comprises:
determining that the third specified bit and the fourth specified bit correspond to a fifth bit and a sixth bit; and
exclusive-or-operating the fifth bit with the sixth bit to obtain the result of the second logical operation.

7. The decoding method according to claim 1, wherein the first bitstream comprises ten bits.

8. The decoding method according to claim 7, wherein a number of bits included in the fourth bitstream are the same as a number of bits included in the second bitstream and/or the third bitstream.

9. A decoding device comprising a processor, wherein the processor is configured to execute instructions to implement a decoding method as claimed in claim 1.

10. A decoding device according to claim 9, wherein the step of obtaining the second bitstream based on a first bitstream comprises:
determining two flag bits in the first bitstream, wherein the two flag bits are not the first specified bit, the second specified bit, the third specified bit, and the fourth specified bit in the first bitstream; and
discarding the two flag bits to obtain the second bitstream.

11. The decoding device according to claim 9, wherein the step of processing the second bitstream to obtain the third bitstream based on the result of the first logical operation of the first specified bit and the second specified bit comprises:
outputting the second bitstream as the third bitstream when the result of the first logical operation is logical false;
obtaining an inverse of a second bit number and an inverse of a fourth bit number in the first bitstream correspondingly as a value assigned to a first bit and a value assigned to a third bit in the second bitstream and outputting the second bitstream with the assigned values as the third bitstream when the result of the first logical operation is logical true.

12. The decoding device according to claim 11, wherein the step of processing the second bitstream to obtain the third bitstream based on the result of the first logical operation of the first specified bit and the second specified bit further comprises:
determining that the first specified bit and the second specified bit corresponds to a zeroth bit and a first bit; and
exclusive-or-operating the zeroth bit with the first bit to obtain the result of the first logical operation.

13. The decoding device according to claim 9, wherein the step of processing the third bitstream to obtain the fourth bitstream based on the result of the second logical operation of the third specified bit and the fourth specified bit comprises:
outputting the third bitstream as the fourth bitstream when the result of the second logical operation is logical false; and
obtaining an inverse of a seventh bit number and an inverse of a ninth bit number in the first bitstream correspondingly as a value assigned to a fifth bit and a value assigned to a seventh bit in the third bitstream and outputting the third bitstream with the assigned values as the fourth bitstream when the result of the second logical operation is logical true.

14. The decoding device according to claim 13, wherein the step of processing the third bitstream to obtain the fourth bitstream based on the result of the second logical operation of the third specified bit and the fourth specified bit further comprises:
determining that the third specified bit and the fourth specified bit corresponds to a fifth bit and a sixth bit; and
exclusive-or-operating the fifth bit with the sixth bit to obtain the result of the second logical operation.

15. The decoding device according to claim 9, wherein the first bitstream comprises ten bits.

16. The decoding device according to claim 15, wherein a number of bits included in the fourth bitstream are the same as a number of bits included in the second bitstream and/or the third bitstream.

17. A non-transitory readable storage medium, wherein the non-transitory readable storage medium stores instructions, and the instructions, when executed, implements a decoding method as claimed in claim 1.

18. The non-transitory readable storage medium according to claim 17, wherein the step of obtaining the second bitstream based on the first bitstream comprises:
determining two flag bits in the first bitstream, wherein the two flag bits are not the first specified bit, the second specified bit, the third specified bit, and the fourth specified bit in the first bitstream; and
discarding the two flag bits to obtain the second bitstream.

19. The non-transitory readable storage medium according to claim 17, wherein the step of processing the second bitstream to obtain the third bitstream based on the result of the first logical operation of the first specified bit and the second specified bit comprises:
outputting the second bitstream as the third bitstream when the result of the first logical operation is logical false; and
obtaining an inverse of a second bit number and an inverse of a fourth bit number in the first bitstream correspondingly as a value assigned to a first bit and a value assigned to a third bit in the second bitstream and outputting the second bitstream with the assigned values as the third bitstream when the result of the first logical operation is logical true.

20. The non-transitory readable storage medium according to claim 19, wherein the step of processing the second bitstream to obtain the third bitstream based on the result of the first logical operation of the first specified bit and the second specified bit further comprises:
determining that the first specified bit and the second specified bit correspond to a zeroth bit and a first bit; and
exclusive-or-operating the zeroth bit with the first bit to obtain the result of the first logical operation.

\* \* \* \* \*